United States Patent [19]

Klein et al.

[11] Patent Number: 4,475,118
[45] Date of Patent: Oct. 2, 1984

[54] DYNAMIC MOS RAM WITH STORAGE CELLS HAVING A MAINLY INSULATED FIRST PLATE

[75] Inventors: Thomas Klein, Saratoga, Calif.; Charles E. Boettcher, Sandy, Utah

[73] Assignee: National Semiconductor Corporation, Santa Clara, Calif.

[21] Appl. No.: 217,425

[22] Filed: Dec. 15, 1980

Related U.S. Application Data

[63] Continuation of Ser. No. 971,784, Dec. 21, 1978, abandoned.

[51] Int. Cl.$^3$ .................. H01L 27/04; G11C 11/40
[52] U.S. Cl. .................. 357/23.6; 357/23.11; 357/51; 357/59; 365/149
[58] Field of Search .............. 365/149, 174; 357/23 C, 357/51, 59, 41, 23 CS

[56] References Cited

U.S. PATENT DOCUMENTS

| | | | |
|---|---|---|---|
| 4,151,607 | 4/1979 | Koyanagi et al. | 365/174 |
| 4,197,554 | 4/1980 | Meusburger et al. | 357/23 C |
| 4,234,889 | 11/1980 | Raymond et al. | 357/68 |
| 4,355,374 | 10/1982 | Sakai et al. | 357/23 C |

FOREIGN PATENT DOCUMENTS

| | | | |
|---|---|---|---|
| 52-31627 | 3/1977 | Japan | 357/23 C |
| 53-4483 | 1/1978 | Japan | 357/23 C |
| 7601416 | 8/1977 | Netherlands | 357/23 C |

OTHER PUBLICATIONS

Smith, Jr., IBM Technical Discl. Bulletin, vol. 15, No. 12, May 1973, pp. 3385-3386.
Barson et al., IBM Tech. Disc. Bul., vol. 16, No. 6, Nov. 1973, p. 1698.
Tasch et al., IEEE Trans. on Electron Devices, vol. Ed-23, No. 2, Feb. 1975, pp. 126-131.

Primary Examiner—William D. Larkins
Attorney, Agent, or Firm—Gail W. Woodward; Paul J. Winters; Michael J. Pollock

[57] ABSTRACT

An improved dynamic MOS RAM having a plurality of selection lines and data lines and a plurality of storage cells connected thereto, wherein each storage cell includes a storage capacitor having first and second plates, wherein the second plate is adapted to be coupled to a reference potential terminal; and a MOSFET having a semiconductor substrate, a gate connected to one of the selection lines, a first conduction terminal coupled to one of the data lines, and a second conduction terminal connected in common with a first plate of the storage capacitor, is disclosed. The first plate of the storage capacitor includes first doped polysilicon conductive layer that has the majority of its area separated from the semiconductor substrate of the MOSFET by at least an insulating layer. The second plate of the storage capacitor includes a second doped polysilicon conductive layer that is at least coextensive with and insulated from the first conductive layer. The transistor gate is defined by a third doped polysilicon conductive layer that is insulated from the first and second conductive layers. Approximately 45% of the cell area can be utilized for charge storage, and only about 20% of this storage area is susceptible to loss of charge by reason of leakage through the depletion/junction area in the substrate.

3 Claims, 9 Drawing Figures

DYNAMIC MOS RAM WITH STORAGE CELLS HAVING A MAINLY INSULATED FIRST PLATE

This application is a continuation of application Ser. No. 971,784, filed Dec. 21, 1978, now abandoned.

BACKGROUND OF THE INVENTION

The present invention generally pertains to microelectronic memories and is particularly directed to an improvement in the storage cell structure of a dynamic metal-oxide-semiconductor (MOS) random access memory (RAM).

Referring to FIG. 1, a dynamic MOS RAM has a plurality of data lines 10 and selection lines 11 and a plurality of storage cells 12 connected thereto. The storage cells 12 are arranged in rows and columns that are connected to the respective data lines 10 and selection lines 11. To address a specific storage cell, signals must be provided on both the data line and the selection line that correspond to that cell. The shading of the cells in FIG. 1 depicts the storage cell in the sixth column corresponding to data line 10f and in the fourth row corresponding to selection line 11d being addressed in response to signals being placed on lines 10f and 11d.

A schematic circuit diagram of a storage cell of a dynamic MOS RAM is shown in FIG. 2. A charge on a given data line 10 representing a data bit is stored on the first plate 21 of a storage capacitor 22 when a field effect transistor (FET) 23 having its conduction terminals 24, 25 respectively connected to the data line 10 and the first plate 21, is gated by a signal on a given selection line 11. The second plate 27 of the storage capacitor 22 is connected to a reference potential terminal $V_{DD}$. The conduction terminals 24, 25 of the FET 23 commonly are referred to as the source and the drain. In a dynamic MOS RAM storage cell the source and drain functions of the conduction terminals are interchangeable depending upon whether data is being stored in or retrieved from the storage cell. Data is retrieved from the cell by the charge stored on the first plate 21 being transferred to the data line 10 when the FET is gated by a signal on the selection line 11.

FIG. 3 is a cross-sectional view (not drawn to scale) of a typical prior art storage cell in a dynamic MOS RAM. The cell includes a semiconductor substrate 28. The first conduction terminal is a region in the substrate defined by a diffusion 29 of conductive material. The first conduction terminal is connected in common with one of the data lines. The second conduction terminal of the MOSFET is defined by a conductive layer 30 at the junction of the semiconductor substrate 28 and an insulating dielectric material 31 deposited thereon. The gate of the MOSFET is defined by a conductive layer 32. The first plate of the storage capacitor is defined by the conductive layer 30; and the second plate of the storage capacitor is defined by the conductive layer 33. The conductive layer 33 is separated from the conductive layer 30 by the insulating layer 31. The conductive layer 32 is separated from the conductive layer 33 and the substrate 28 by an insulating layer 34. Typically the conductive layer 30 is an inversion layer which is formed in a depletion region 35 that is created when the conductive layer 33 is biased with respect to the substrate 28. Alternatively the conductive layer 30 is an implanted layer in the substrate 28 that is formed in accordance with the teaching of pending U.S. patent application entitled "Semiconductor Capacitor Especially Useful In An Integrated Semiconductor Structure With An MOS Device Including Fabrication Methods Therefor", Ser. No. 788,872 filed Apr. 19, 1977 by the inventors herein together with Andrew G. Varadi. A gating signal applied to the conductive layer 32 enables charge to be transferred between the conductive region 29 and the conductive layer 30.

The prior art structure of FIG. 3 has certain disadvantages. The presence of the first plate 30 of the storage capacitor in the substrate 28 makes it necessary to dedicate at least a minimum portion of the substrate for providing isolation between the respective conductive layers 30 that define the first plates in adjacent cells. As a result the storage capacitor occupies only about 20% of the area in a single cell.

Also, there is significant leakage of charge from the first plate 30 of the storage capacitor through the depletion region 35 in the substrate 28.

SUMMARY OF THE INVENTION

In accordance with the present invention, a dynamic MOS RAM having a plurality of selection lines and data lines and a plurality of storage cells connected thereto, wherein each storage cell includes a storage capacitor having first and second plates; wherein the second plate is adapted to be coupled to a reference potential terminal; and a MOSFET having a semiconductor substrate, a gate connected to one of the selection lines, a first conduction terminal coupled to one of the data lines, and a second conduction terminal connected in common with a first plate of the storage capacitor; is characterized by the first plate of each storage capacitor including a first doped polysilicon conductive layer; the second plate of the storage capacitor including a second doped polysilicon layer that is at least coextensive with and insulated from the first conductive layer; and the transistor gate being defined by a third doped polysilicon conductive layer that is insulated from the first and second conductive layers that has the majority of its area separated from the semiconductor substrate of the MOSFET by at least an insulating layer.

The improved dynamic MOS RAM of the present invention has several advantages over the prior art device discussed hereinabove. Because the majority of the conductive layer which defines the first plate of the storage capacitor is not in the substrate, the amount of isolation required between the respective storage capacitors of adjacent cells is substantially reduced such that it is limited only by photolithographic resolution requirements. Thus, the storage capacitor may occupy as much as approximately 45% of the total cell area, in contrast to only about 20% in the prior art device. Therefore more charge can be stored in a cell having a given area.

Another advantage of the majority of the conductive layer which defines the first plate of the storage capacitor not being in the substrate is that charge leakage through the depletion region in the substrate is substantially reduced to such that would occur in an area corresponding to only about 20% of the area of the storage capacitor.

Thus it is seen that the storage cells of the improved dynamic MOS RAM of the present invention are considerably more efficient, whereby the cells and the overall dimensions of the dynamic MOS RAM can be made smaller.

In the preferred embodiment of the present invention, the conductive layers of the storage capacitor are made of doped polysilicon. Since the insulating material that serves as the dielectric of the storage capacitor does not have to be optimized for use as the gate dielectric of an MOS gate device, this insulating dielectric material may have a higher dielectric constant than $SiO_2$, thereby enabling the use of a higher dielectric constant material such as $Si_3N_4$.

Also the storage capacitor can have a thinner dielectric material layer because the conductive material defining the second plate of the storage capacitor may be connected to ground whereby it is not susceptible to transients induced either by variations or electrical noise in an external supply voltage, or by static discharge induced by handling.

A further advantage of the majority of the conductive layer which defines the first plate of the storage capacitor not being in the substrate is that the storage cells are less susceptible to soft errors caused by alpha particle radiation emitted by heavy metal contaminants present in ceramic material packages and sealing glosses used to hold the dynamic MOS RAM.

Also a higher yield occurs upon fabrication because less of the substrate area is being utilized electrically, whereby it is less sensitive to defects in material.

Additional features of the present invention are described in the description of the preferred embodiments.

DESCRIPTION OF THE PREFERRED EMBODIMENTS

Figure 1:
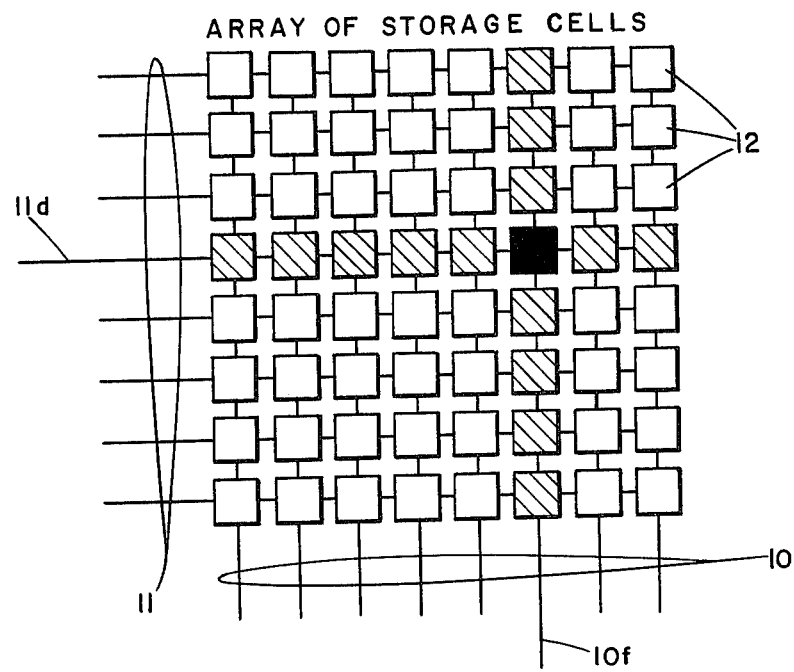
FIG. 1 is a schematic diagram of a dynamic MOS RAM.
Figure 2:
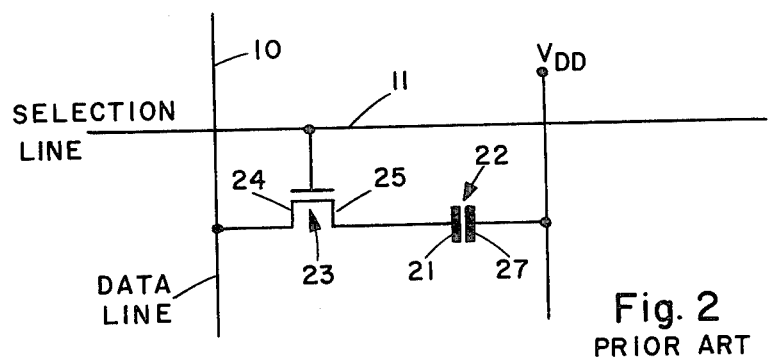
FIG. 2 is a schematic circuit diagram of a storage cell included in the dynamic MOS RAM of FIG. 1.
Figure 3:
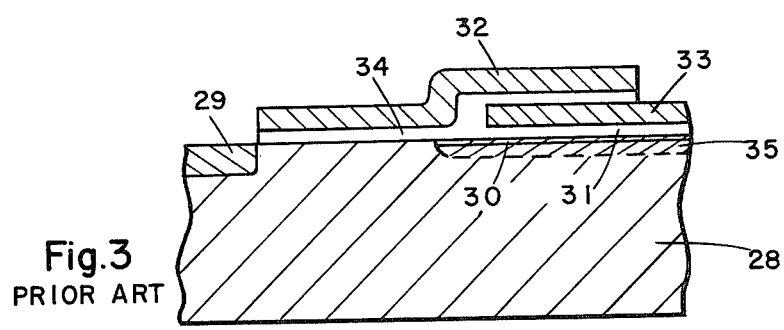
FIG. 3 is a cross-sectional view of a typical prior art storage cell included in the dynamic MOS RAM of FIG. 1, and corresponding to the schematic circuit diagram of the storage cell of FIG. 2.

One preferred embodiment of a storage cell having a semiconductor substrate according to the present invention for a dynamic MOS RAM is described with reference to FIGS. 4,5,6,7 and 8. Each storage cell includes a semiconductor substrate 37, first and second conductive regions 38 and 39 in the substrate 37, a first conductive layer 40, a second conductive layer 41, a third conductive layer 42, and a metalization layer 43. The metalization layer 43 is not shown in FIG. 4 except where it makes contact with the first conductive region 38.

The substrate 37 is p-type silicon. The first and second conductive regions 38 and 39 in the substrate 37 are N+ diffusions formed by doping the silicon substrate 37 with phosphorous ions.

The first conductive region 38 is connected in common with a data line of the MOS RAM. Each data line is defined by a metalization layer 43. The first conductive region 38 also defines a first conduction terminal.

The second conductive region 39 defines a second conduction terminal.

The first, second, and third conductive layers 40, 41, 42 are doped polysilicon. Alternatively the first, second, and third conductive layers are a refractory metal (such as platinum, molybdenum, or tungsten) or a refractory metal silicide.

Figure 4:
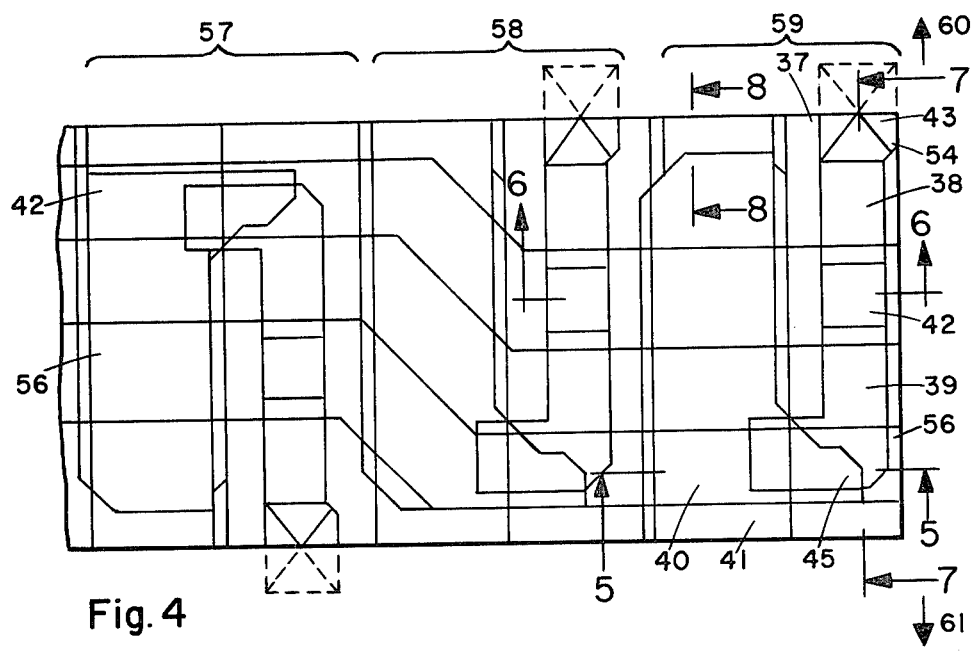
FIG. 4 is a top plan view of one preferred embodiment of a plurality of adjacent storage cells having a semiconductor substrate according to the present invention in a dynamic MOS RAM.
Figure 5:
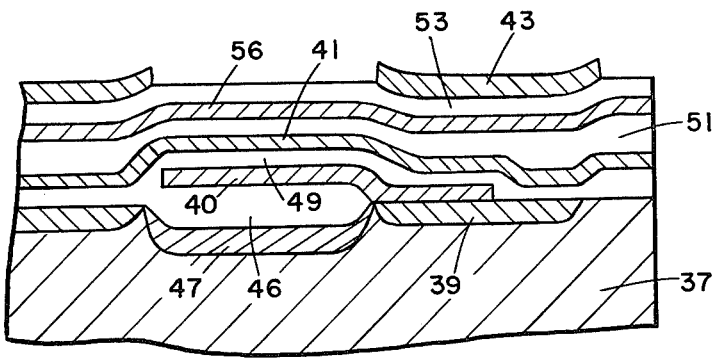
FIG. 5 is a cross-sectional view of a portion of the storage cell array of FIG. 4 taken along line 5—5.
Figure 6:
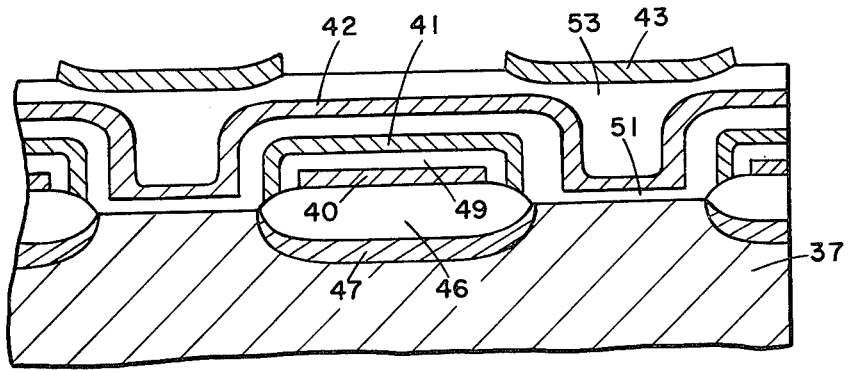
FIG. 6 is a cross-sectional view of a portion of the storage cell array of FIG. 4 taken along line 6—6.

The first conductive layer 40 defines the first plate of a storage capacitor and contacts the second conductive region 39 in the small sub-region 45 (FIG. 4). The majority of the first conductive layer 40 is insulated from the substrate 37 by an insulating dielectric material layer 46 of $SiO_2$, $Si_3N_4$, or a combination thereof which is at least partially recessed in a surface of the substrate 37.

That portion 47 of the substrate 37 which makes contact with the insulating layer 46 is P+ silicon formed by doping the substrate 37 with boron ions. The region 47 is so doped to reduce the chance of charge leakage between adjacent storage cells.

The second conductive layer 41 completely overlaps the first conductive layer 40 and defines a second plate of the storage capacitor. The second conductive layer 41 is adapted to be connected to a reference potential terminal. In the use of the preferred embodiment, the reference potential terminal is at ground potential.

The second conductive layer 41 is insulated from the first conductive layer 40 and the substrate 37 by an insulating dielectrica material layer 49 of $SiO_2$, or $Si_3N_4$, or a combination thereof.

Each third conductive layer 42 forms one of the selection lines of the dynamic MOS RAM. The third conductive layer 42 defines a transistor gate and together with the first and second conduction terminals 38 and 39 forms a MOSFET. When a control signal is placed on the selection line, the transistor gate defined by the third conductive layer 42 enables the transfer of charge in the substrate 37 between the first and second conduction terminals 38 and 39, and thereby enables charge transfer between the data line 43 and the first plate 40 of the storage capacitor.

The third conductive layer 42 is insulated from the second conductive layer 41 and the substrate 37 by an insulating dielectric material layer 51 of $SiO_2$, $Si_3N_4$, or a combination thereof.

The metalization layer 43 is either aluminum or plated polysilicon. The metalization layer 43 is insulated from the second and third conductive layers 41, 42 and the substrate 37 by an insulating layer 53 of $SiO_2+P_2O_5$ except in a region 54 where the metalization layer 43 contacts the first conductive region 38.

Figure 7:
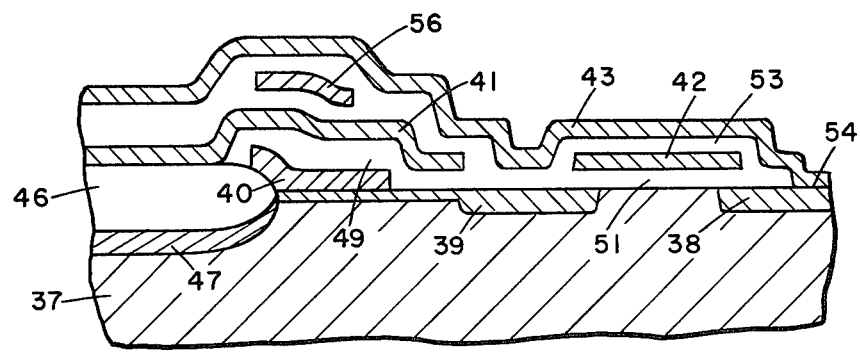
FIG. 7 is a cross-sectional view of a portion of the storage cell array of FIG. 4 taken along line 7—7.
Figure 8:
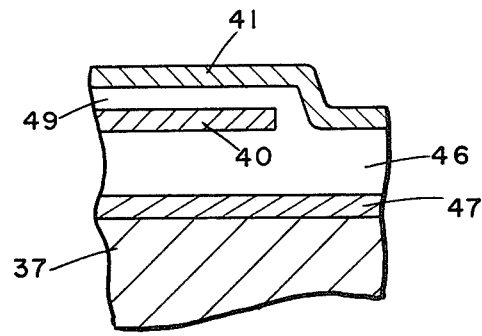
FIG. 8 is a cross-sectional view of a portion of the storage cell array of FIG. 4 taken along line 8—8.

Referring to FIGS. 4 and 7, a conductive layer 56 is shown. This conductive layer is the third conductive layer in the storage cell 57. Notice that storage cell 57 is disposed differently than storage cells 58 and 59, to which the cross-sectional views of FIGS. 5 through 8 correspond. The storage cell 57 is disposed the same as the storage cells (not shown) that are adjacent the storage cells 58 and 59 in the directions 60 and 61 in the array of storage cells in the dynamic MOS RAM. The conductive layer 56 performs no function in the storage cells 58 and 59; and the conductive layer 42 performs no function in the storage cell 57.

Figure 9:
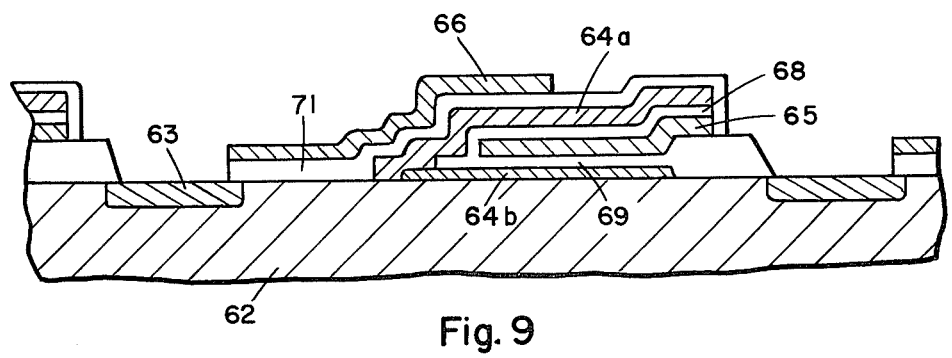
FIG. 9 is a cross-sectional view of an alternative preferred embodiment of a storage cell having a semiconductor substrate according to the present invention in a dynamic MOS RAM.

An alternative preferred embodiment of a storage cell having a semiconductor substrate according to the present invention for a dynamic MOS RAM is shown in cross-section in FIG. 9. Each storage cell of this embodiment includes a semiconductor substrate 62, a conduction terminal 63, a storage capacitor including a first plate 64a, 64b, a second plate 65, and a transistor gate 66.

The conduction terminal 63 is defined by a diffusion forming a conductive region in the semiconductor substrate 62. The first conduction terminal 63 is connected in common with a given data line (not shown).

The first plate of the storage capacitor includes two conductive layers 64a and 64b. The conductive layer 64a is doped polysilicon which contacts the substrate 62 and also makes peripheral contact with the conductive layer 64b. The conductive layer 64b is a layer of doped polysilicon on the substrate 62. Alternatively, the conductive layers 64a, 64b are a refractory metal or a refractory metal silicide. The majority 64a of the conductive layers 64a, 64b forming the first plate of the storage capacitor is insulated from the substrate by an insulating dielectric material layers 68 and 69 of $SiO_2$, $Si_3N_4$, or a combination thereof.

The second plate 65 of the storage capacitor is defined by a conductive layer 65 that lies intermediate the conductive layers 64a and 64b defining the first plate and is insulated therefrom by the insulating dielectric material layers 68 and 69. The conductive layer 65 is doped polysilicon, a refractory metal or a refractory metal silicide.

The transistor gate 66 is defined by a conductive layer 66 of doped polysilicon. Alternatively, the conductive layer 66 is a refractory metal or a refractory metal silicide. The transistor gate 66 is insulated from the substrate 62 and the first plate 64a, 64b of the storage capacitor by an insulating dielectric material layer 71 of $SiO_2$, $Si_3N_4$, or a combination thereof. The transistor gate 66 is connected to a selection line (not shown) and enables the transfer of charge in the substrate 62 between the conduction terminal 62 and the first plate 64a, 64b when a signal is placed on the selection line.

What is claimed is:

1. A dynamic MOS RAM having a plurality of selection lines, a plurality of data lines, and a plurality of storage cells, wherein each storage cell comprises in combination:
    a semiconductor substrate region;
    recessed insulating means extending partially into said substrate region for providing at least partial electrical isolation of said storage cell;
    at least one MOSFET including a portion of said substrate region and having a first conduction terminal electrically coupled to one of said data lines, and having a second conduction terminal and a gate; and
    a storage capacitor having first and second plates, said first plate having a predominant portion of its area over said recessed insulating means and being in direct physical and electrical contact with said second conduction terminal, said second plate being coupled to a reference potential terminal and completely overlapping said first plate and wherein one of said selection lines lies over both of said first and second plates and is coupled to said gate.

2. The MOS RAM of claim 1, wherein said second plate lies between said first plate and said one of said selection lines.

3. The MOS RAM of claim 1, wherein said first plate comprises doped polycrystalline silicon means for providing said first plate and also for providing said second conduction terminal.

* * * * *